(12) United States Patent
Zhao et al.

(10) Patent No.: US 9,140,982 B2
(45) Date of Patent: Sep. 22, 2015

(54) NEGATIVE LIGHT SENSITIVE RESIN COMPOSITION, COLOR FILTER AND LIQUID CRYSTAL DISPLAY DEVICE

(75) Inventors: Jisheng Zhao, Beijing (CN); Lin Li, Beijing (CN); Shi Shu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 85 days.

(21) Appl. No.: 13/700,479

(22) PCT Filed: Aug. 1, 2012

(86) PCT No.: PCT/CN2012/079536
§ 371 (c)(1),
(2), (4) Date: Nov. 28, 2012

(87) PCT Pub. No.: WO2013/017091
PCT Pub. Date: Feb. 7, 2013

(65) Prior Publication Data
US 2013/0129941 A1  May 23, 2013

(30) Foreign Application Priority Data
Aug. 4, 2011 (CN) .......................... 2011 1 0223106

(51) Int. Cl.
*C09K 19/00* (2006.01)
*G03F 7/038* (2006.01)
(Continued)

(52) U.S. Cl.
CPC *G03F 7/038* (2013.01); *G02B 5/20* (2013.01); *G03F 7/0007* (2013.01); *G03F 7/027* (2013.01);
(Continued)

(58) Field of Classification Search
CPC ....... G03F 7/038; G03F 7/027; G03F 7/0007; G03F 7/033; Y10T 428/1036; Y10T 428/1041; Y10T 428/1059; Y10T 428/1077; Y10T 428/1082; C08G 59/3218; G02B 5/20; G02B 5/201; G02B 5/223

USPC ............... 428/1.1, 1.5, 1.54, 1.55; 430/270.1, 430/271.1, 281.1, 285.1, 495.1, 496, 507, 430/46.3, 46.4; 427/508, 552, 553, 555, 427/558; 526/283; 524/553
See application file for complete search history.

(56) References Cited

U.S. PATENT DOCUMENTS 2,383,399 A * 8/1945 Lundquist ..................... 526/204
3,226,452 A * 12/1965 Manyak et al. ................. 525/48
(Continued)

FOREIGN PATENT DOCUMENTS

CN    101006393 A    7/2007
CN    101107566 A    1/2008
(Continued)

OTHER PUBLICATIONS

Zhang Bing, et al; "Research on the Copolymerization between α-Pinene, Maleic Anhydride and Styrene", Synthetic Material Aging and Application, Feb. 2008, 6 pages.
(Continued)

*Primary Examiner* — Ruiyun Zhang
(74) *Attorney, Agent, or Firm* — Ladas & Parry LLP

(57) ABSTRACT

Embodiments of the invention provide a negative light sensitive resin composition, a color filter and a liquid crystal display device. The negative light sensitive resin composition comprises: an alkaline soluble resin, which is a terpolymer, or a derivative of the terpolymer, made from the following three monomers: styrene, α-pinene, and a carboxylic acid or anhydride containing an unsaturated double bond; a light sensitive resin containing ethylene unsaturated double bonds, which is in a mass ratio of 0.1 to 1.2:1 to the alkaline soluble resin; a photoinitiator, which is in a mass ratio of 0.0001 to 0.001:1 to the composition; a modifying adjuvant, which is in a mass ratio of 0.001 to 0.01:1 to the solid fraction in the composition; and a solvent, which is in a mass ratio of 2 to 20:1 to the solid fraction in the composition. The color filter and the liquid crystal display device comprise a light filter structure formed by the curing of the aforementioned negative light sensitive resin composition.

12 Claims, 1 Drawing Sheet

(51) Int. Cl.
*G02B 5/20* (2006.01)
*G03F 7/00* (2006.01)
*G03F 7/027* (2006.01)

(52) U.S. Cl.
CPC .............. *G03F 7/0388* (2013.01); *G02B 5/201* (2013.01); *Y10T 428/1036* (2015.01); *Y10T 428/1082* (2015.01)

(56) References Cited

U.S. PATENT DOCUMENTS

| | | | |
|---|---|---|---|
| 4,172,861 A | | 10/1979 | Li et al. |
| 5,756,624 A | * | 5/1998 | Behr et al. .................... 526/309 |
| 6,028,123 A | * | 2/2000 | Hirayama et al. ............ 522/151 |
| 2007/0292805 A1 | | 12/2007 | Miura et al. |
| 2009/0130596 A1 | * | 5/2009 | Teng .......................... 430/281.1 |

FOREIGN PATENT DOCUMENTS

| | | |
|---|---|---|
| CN | 101655664 A | 2/2010 |
| EP | 0 209 753 A2 | 1/1987 |
| EP | 0 341 956 A2 | 11/1989 |
| EP | 0 857 758 A1 | 8/1998 |
| EP | 1 153 977 A1 | 11/2001 |
| EP | 1 231 233 A1 | 8/2002 |

OTHER PUBLICATIONS

International Search Report; dated Nov. 15, 2012; PCT/CN2012/079536.
$2^{nd}$ Chinese Office Action dated Oct. 14, 3013; Appln. No. 201110223106.4.
International Preliminary Report on Patentability dated Feb. 4, 2014, PCT/CN2012/079536.

* cited by examiner

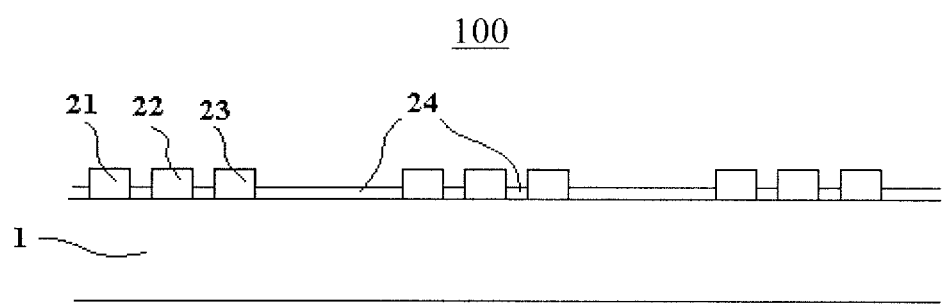

NEGATIVE LIGHT SENSITIVE RESIN COMPOSITION, COLOR FILTER AND LIQUID CRYSTAL DISPLAY DEVICE

TECHNICAL FIELD

Embodiments of the invention relate to a negative light sensitive resin composition, a color filter and a liquid crystal display device.

BACKGROUND

A negative light sensitive resin composition (also called negative photoresist) is widely used to prepare color filter structures, light sensitive materials in a coating, light shading materials, spacers in a liquid crystal display panel, or used in fields such as photolithography for semiconductor manufacturing processes and the like. A negative light sensitive resin composition may comprises an alkaline soluble resin, a light sensitive resin, a photoinitiator, a modifying adjuvant, a solvent and the like.

The alkaline soluble resin is soluble in an alkaline solution; the light sensitive resin, comprising ethylene unsaturated double bonds and epoxy groups, can undergo curing under light so as to cure and render insoluble the exposed portion (in which the alkaline soluble resin also undergoes reaction), wherein the unexposed portion (in which the alkaline soluble resin still maintains the original state) can be removed by dissolving with an alkaline solution so as to achieve the imaging; the photoinitiator is used to initiator the curing reaction; the modifying adjuvant is used to adjust various properties of the negative light sensitive resin, which may include binding promoters, antioxidants, ultraviolet light absorbent, deflocculating agents, leveling agents and the like; the solvent is used to solve the solid fraction in the negative light sensitive resin composition (that is, all components other than the solvent) so as to liquefy the negative light sensitive resin composition to facilitate spreading.

The negative light sensitive resin composition may also comprise other well known component(s). For example, in certain applications (for example, when used for the light filtering structure of a color filter), the negative light sensitive resin composition may also comprise a pigment.

SUMMARY

An embodiment of the invention provides a negative light sensitive resin composition having stable viscosity, good image development and few defects.

According to an embodiment of the invention, a negative light sensitive resin composition comprises:

an alkaline soluble resin, which is a terpolymer, or a derivative of the terpolymer, made from the following three monomers: styrene, α-pinene, and a carboxylic acid or anhydride containing an unsaturated double bond;

a light sensitive resin containing ethylene unsaturated double bonds, which is in a mass ratio of 0.1 to 1.2:1 to the alkaline soluble resin;

a photoinitiator, which is in a mass ratio of 0.0001 to 0.001:1 to the negative light sensitive resin composition;

a modifying adjuvant, which is in a mass ratio of 0.001 to 0.01:1 to the solid fraction in the negative light sensitive resin composition; and a solvent, which is in a mass ratio of 2 to 20:1 to the solid fraction in the negative light sensitive resin composition.

As an example of the embodiments of the invention, among the three monomers of the alkaline soluble resin, the carboxylic acid or anhydride containing an unsaturated double bond has a molar ratio of 0.2 to 1:1 to styrene; and α-pinene is in a molar ratio that is higher than 0 but lower than or equal to 1:1 to styrene.

As an example of the embodiments of the invention, among the three monomers of the alkaline soluble resin, the carboxylic acid or anhydride containing an unsaturated double bond has a molar ratio of 0.8 to 1:1 to styrene; and α-pinene is in a molar ratio of 1:1 to the carboxylic acid or anhydride containing an unsaturated double bond.

As an example of the embodiments of the invention, the carboxylic acid or anhydride containing an unsaturated double bond is any one of acrylic acid, methacrylic acid, crotonic acid, maleic acid, fumaric acid, citraconic acid, mesaconic acid, itaconic acid, acrylic anhydride, methacrylic anhydride, crotonic anhydride, maleic anhydride, fumaric anhydride, citraconic anhydride, mesaconic anhydride and itaconic anhydride.

As an example of the embodiments of the invention, the alkaline soluble resin has a structure of

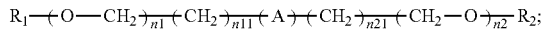

wherein A represents a copolymer chain segment consisting of n3

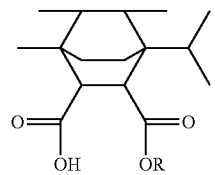

groups and n4

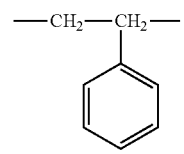

groups n1 is an integer of 0 to 5, with a proviso that when n1 is 0, n11 is also 0, and when n1 is not 0, n11 is 1;

n2 is an integer of 0 to 5, with a proviso that when n2 is 0, n21 is also 0, and when n2 is not 0, n21 is 1;

n3 is an integer of 20 to 400;

n4 is an integer of 20 to 400, and n4 is higher than or equal to n3;

R1 is any one of an acrylate substituent, a methacrylate substituent, and a crotonate substituent;

R2 is any one of an acrylate substituent, a methacrylate substituent, and a crotonate substituent; and R is any one of hydrogen, an acrylate substituent, a methacrylate substituent, and a crotonate substituent.

As an example of the embodiments of the invention, the A represents an alternating copolymer chain segment consisting of the

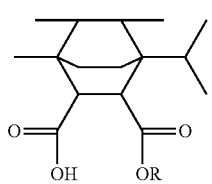

group and the

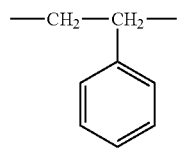

group.

As an example of the embodiments of the invention, the weight average molecular weight of the alkaline soluble resin is from 6000 Da (Dalton) to 40000 Da, for example from 6000 Da to 20000 Da.

As an example of the embodiments of the invention,
the mass ratio between the light sensitive resin and the alkaline soluble resin is from 0.4 to 1.2:1;
the mass ratio between the photoinitiator and the negative light sensitive resin composition is from 0.0005 to 0.001:1;
the mass ratio between the modifying adjuvant and the solid fraction in the negative light sensitive resin composition is from 0.002 to 0.008:1; and
the mass ratio between the solvent and the negative light sensitive resin composition is from 2 to 15:1.

As an example of the embodiments of the invention, the modifying adjuvant includes at least one of a binding promoter, an antioxidant, an ultraviolet light absorbent, an antiflocculant, or a leveling agent.

As an example of the embodiments of the invention, the negative light sensitive resin composition has a viscosity from 1.2 cps to 6 cps at 25□.

As an example of the embodiments of the invention, the negative light sensitive resin composition has a viscosity from 1.2 cps to 3.5 cps at 25□.

As an example of the embodiments of the invention, the negative light sensitive resin composition further comprises:
a pigment, which is in a mass ratio of 0.04 to 0.15:1 to the negative light sensitive resin composition.

The aforementioned solid fraction in the negative light sensitive resin composition refers to any substance in the negative light sensitive resin composition that is in a solid state before being dissolved with the solvent, that is, all substances other than the solvent. This definition applies infra also.

An embodiment of the invention also provides a color filter, which has a light filtering structure that has small steps and good performance.

According to an embodiment of the invention, a color filter comprises a substrate and a light filtering structure formed by the curing of the aforementioned pigment containing negative light sensitive resin composition on the substrate.

Since the light filter structure on the color filter is obtained by the curing of the aforementioned negative light sensitive resin composition, it has a light filtering structure that has small steps and good performance.

An embodiment of the invention provides a crystal liquid display device comprising the aforementioned color filter.

Due to the employment of the aforementioned color filter, its color filter has a light filtering structure that has small steps and good performance.

BRIEF DESCRIPTION OF THE DRAWINGS

In order to more clearly illustrate the technical solution of the embodiments of the invention, the FIGURES of the embodiments will be briefly introduced as follows. Apparently, the FIGURES in the following description are merely directed to some embodiments of the invention, rather than limit the invention.

FIG. 1 is a diagram of the cross section of the color filter of an embodiment of the invention.

DETAILED DESCRIPTION

In order to make the object, technical solutions and advantages of the embodiments of the invention more clear, the technical solutions of the embodiments of the invention will be clearly and completely described as follows with reference to the FIGURES of the embodiments of the invention. It is apparent that the described embodiments are a portion of the embodiments of the invention, rather than all the embodiments. Based on the described embodiments of the invention, any other embodiment that is achieved by a person of ordinary skill in the art without resorting to creative labor belongs to the scope of protection of the invention.

During the research, the inventors have found that the aforementioned techniques have at least the following issues. As the continuous increase of the requirements on the image development (including resolution, speed of development, and the like) of a negative light sensitive resin composition, the content of the alkaline soluble resin, which has high viscosity, needs to be increased, but this will cause the increase of the viscosity of the negative light sensitive resin composition, and result in an increased step (that is, there will be a difference in thickness from the portion that does not have the negative light sensitive resin composition); increase of the acidic value of the alkaline soluble resin may also improve the image development of the negative light sensitive resin composition, but this will also decrease the compatibility of the alkaline soluble resin with other components, resulting in various defects. In sum, it is difficult for current negative light sensitive resin compositions to ensure a stable viscosity, good image development and few defects at the same time.

In the description herein, "a first value to a second value" means this number is more than or equal to the first value and less than or equal to the second value, that is, inclusive of the end points.

An embodiment of the invention provides a negative light sensitive resin composition comprising:
an alkaline soluble resin, which is a terpolymer, or a derivative of the terpolymer, made from the following three monomers: styrene, α-pinene, and a carboxylic acid or anhydride containing an unsaturated double bond;
a light sensitive resin containing ethylene unsaturated double bonds, which is in a mass ratio of 0.1 to 1.2:1 to the alkaline soluble resin;
a photoinitiator, which is in a mass ratio of 0.0001 to 0.001:1 to the negative light sensitive resin composition;
a modifying adjuvant, which is in a mass ratio of 0.001 to 0.01:1 to the solid fraction in the negative light sensitive resin composition; and
a solvent, which is in a mass ratio of 2 to 20:1 to the solid fraction in the negative light sensitive resin composition.

During the copolymerization of the three monomers of the alkaline soluble resin, styrene, α-pinene, and a carboxylic acid or anhydride containing an unsaturated double bond, α-pinene preferably undergoes Diels-Alder reaction with the carboxylic acid or anhydride containing an unsaturated double bond, while the products of this reaction, styrene and the remaining α-pinene and carboxylic acid or anhydride will continue copolymerization with one another.

For example, in an embodiment the carboxylic acid or anhydride containing an unsaturated double bond has a molar ratio of 0.2 to 1:1 to styrene; and α-pinene is in a molar ratio that is higher than 0 but lower than or equal to 1:1 to styrene. Preferably, the carboxylic acid or anhydride containing an unsaturated double bond has a molar ratio of 0.8 to 1:1 to styrene; and α-pinene is in a molar ratio of 1:1 to the carboxylic acid or anhydride containing an unsaturated double bond.

For example, the carboxylic acid or anhydride containing an unsaturated double bond is any one of acrylic acid, methacrylic acid, crotonic acid, maleic acid, fumaric acid, citraconic acid, mesaconic acid, itaconic acid, acrylic anhydride, methacrylic anhydride, crotonic anhydride, maleic anhydride, fumaric anhydride, citraconic anhydride, mesaconic anhydride and itaconic anhydride.

The derivative of the terpolymer may be a derivative obtained by introduction of an ester substituent containing an unsaturated double bond and/or an alkoxyl chain segment into the terpolymer.

For example, the alkaline soluble resin has the structure represented in General Formula I:

$$R_1\!-\!(\!O\!-\!CH_2)_{n1}\!-\!(CH_2)_{n11}\!-\!(A)\!-\!(CH_2)_{n21}\!-\!(CH_2\!-\!O)_{n2}\!-\!R_2; \quad (I)$$

wherein A represents a copolymer chain segment consisting of n3

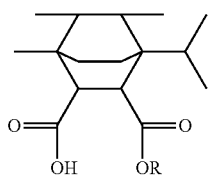

groups and n4

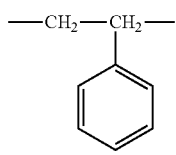

groups, wherein this

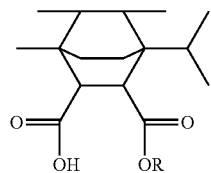

group is a derivative of the group obtained by the reaction between α-pinene and maleic acid or maleic anhydride;

n1 is an integer between 0 and 5, with the proviso that when n1 is 0, n11 is also 0, and when n1 is not 0, n11 is 1;

n2 is an integer of 0 to 5, with the proviso that when n2 is 0, n21 is also 0, and when n2 is not 0, n21 is 1;

n3 is an integer of 20 to 400;

n4 is an integer of 20 to 400, and n4 is higher than or equals to n3;

R1 is any one of an acrylate substituent, a methacrylate substituent, and a crotonate substituent;

R2 is any one of an acrylate substituent, a methacrylate substituent, and a crotonate substituent; and R is any one of hydrogen, an acrylate substituent, a methacrylate substituent, and a crotonate substituent.

More preferably, A represents an alternating copolymer chain segment consisting of the

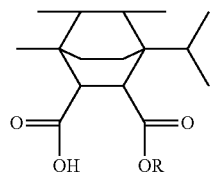

group and the

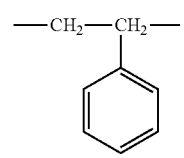

group, or in other words, here the alkaline soluble resin has the following general formula:

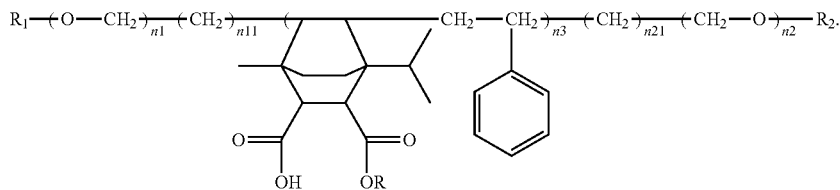

Preferably, the weight average molecular weight of the alkaline soluble resin is from 6000 Da to 40000 Da, more preferably from 6000 Da to 20000 Da.

Preferably, the negative light sensitive resin composition has a viscosity from 1.2 cps to 6 cps at 25□, more preferably from 1.2 cps to 5.5 cps, and most preferably from 1.2 cps to 3.5 cps. This viscosity may primarily be adjusted by adjusting the content of the alkaline soluble resin and the solvent.

Preparation of the Alkaline Soluble Resin

EXAMPLE 1

0.2 mol acrylic acid, 0.1 mol α-pinene and 4 g 2,2-azobisisobutyronitrile (AIBN), an initiator, are subjected to agitation and reflux in a propylene glycol monoethyl ether solvent at 75□. During the agitation, 1 mol styrene is gradually added dropwise. The reaction is allowed to last for 1 hour, resulting in a terpolymer of acrylic acid, α-pinene and styrene. After cooling, a sticky alkaline soluble resin is obtained. Its weight average molecular weight is measured through gel permeation chromatography (GPC) as 6200 Da. Its viscosity is measured by a rotational viscometer as 8.2 cps.

EXAMPLE 2

0.8 mol crotonic acid, 0.5 mol α-pinene and 7 g 2,2-azobisisobutyronitrile, an initiator, are subjected to agitation and reflux in a propylene glycol monoethyl ether solvent at 75□. During the agitation, 1 mol styrene is gradually added dropwise. The reaction is allowed to last for 4 hour, resulting in a terpolymer of crotonic acid, α-pinene and styrene. Subsequently, temperature is adjusted to 120□, and 5 g 2-mercaptoethanol is added as a chain transfer agent (for introducing alkoxyl chain segments). The mixture is subjected to agitation and reflux reaction for 7 hours. After cooling, a sticky alkaline soluble resin is obtained. Its weight average molecular weight is measured through gel permeation chromatography as 37500 Da. Its viscosity is measured by a rotational viscometer as 9 cps.

Introduction of alkoxyl chain segments into the alkaline soluble resin can increase its water solubility, so as to increase its speed of development and improve the image development.

EXAMPLE 3

1 mol maleic anhydride, 1 mol α-pinene and 8 g 2,2-azobisisobutyronitrile, an initiator, are subjected to agitation and reflux in a propylene glycol monoethyl ether solvent at 75□. During the agitation, 1 mol styrene is gradually added dropwise. The reaction is allowed to last for 3 hour, resulting in a terpolymer of maleic anhydride, α-pinene and styrene. Subsequently, temperature is adjusted to 120□, and 6 g 2-mercaptoethanol is added as a chain transfer agent (for introducing alkoxyl chain segments). The mixture is subjected to agitation and reflux reaction for 7 hours, before 0.1 g methoxyhydroquinone, a thermal polymerization inhibitor, is then added into the reaction products. In the presence of a catalyst, 8 g ethoxylated acrylate monomer are added and mixed for reacting for 10 hours (for introducing an ester substituent containing an unsaturated double bond). After cooling, a sticky alkaline soluble resin is obtained. Its weight average molecular weight is measured through gel permeation chromatography as 10300 Da. Its viscosity is measured by a rotational viscometer as 8.5 cps.

Introduction of an ester substituent containing an unsaturated double bond into the alkaline soluble resin can improve its curing property.

EXAMPLE 4

0.9 mol maleic acid, 0.7 mol α-pinene and 7 g 2,2-azobisisobutyronitrile, an initiator, are subjected to agitation and reflux in a propylene glycol monoethyl ether solvent at 75□. During the agitation, 1 mol styrene is gradually added dropwise. The reaction is allowed to last for 2 hour, resulting in a terpolymer of maleic acid, α-pinene and styrene. Subsequently, temperature is adjusted to 120□, and 5 g 2-mercaptoethanol is added as a chain transfer agent (for introducing alkoxyl chain segments). The mixture is subjected to agitation and reflux reaction for 7 hours, before 0.1 g methoxyhydroquinone, a thermal polymerization inhibitor, is then added into the reaction products. In the presence of a catalyst, 8 g ethoxylated acrylate monomer are added and mixed for reacting for 10 hours (for introducing an ester substituent containing an unsaturated double bond). After cooling, a sticky alkaline soluble resin is obtained. Its weight average molecular weight is measured through gel permeation chromatography as 19000 Da. Its viscosity is measured by a rotational viscometer as 8.9 cps.

Those skilled in the art may also elect to use other different processes (such as different reaction schemes, reaction duration, reaction temperature, types of the catalyst and the amount of the catalyst) to prepare the aforementioned terpolymer or derivatives thereof, which will not be elaborated here.

The negative light sensitive resin composition is obtained by mixing and thoroughly agitating the alkaline soluble resin prepared from the aforementioned examples, a light sensitive resin containing ethylene unsaturated double bonds, a photoinitiator, a modifying adjuvant, and a solvent. The negative light sensitive resin composition may also comprise a pigment which is in a mass ratio of 0.04 to 0.15:1, for example 0.1 to 0.15:1, to the negative light sensitive resin composition. The pigment may be mixed with a portion of the solvent to a pigment solution, and then the pigment solution is mixed with other solid fractions. After mixed thoroughly, other solvent is added to regulate the viscosity of the negative light sensitive resin composition.

The raw materials and ingredients selected for the specifically prepared negative light sensitive resin composition samples are as follows.

Sample 1: the alkaline soluble resin prepared in the aforementioned Example 1 is used, while the alkaline soluble resin is 10 g, the light sensitive resin is 12 g (in a mass ratio of 1.2:1 to the alkaline soluble resin), the photoinitiator is 0.046 g (in a mass ratio of 0.0001:1 to the negative light sensitive resin composition), the modifying adjuvant is 0.022 g (in a mass ratio of 0.001:1 to the solid fractions in the negative light sensitive resin composition), and the solvent is 441 g (in a mass ratio of 20:1 to the solid fractions in the negative light sensitive resin composition).

Sample 2: the alkaline soluble resin prepared in the aforementioned Example 2 is used, while the alkaline soluble resin is 10 g, the light sensitive resin is 1 g (in a mass ratio of 0.1:1 to the alkaline soluble resin), the photoinitiator is 0.034 g (in a mass ratio of 0.001:1 to the negative light sensitive resin composition), the modifying adjuvant is 0.12 g (in a mass ratio of 0.01:1 to the solid fractions in the negative light sensitive resin composition), and the solvent is 22.2 g (in a mass ratio of 2:1 to the solid fractions in the negative light sensitive resin composition).

Sample 3: the alkaline soluble resin prepared in the aforementioned Example 3 is used, while the alkaline soluble resin is 10 g, the light sensitive resin is 4 g (in a mass ratio of 0.4:1 to the alkaline soluble resin), the photoinitiator is 0.34 g (in a mass ratio of 0.0005:1 to the negative light sensitive resin composition), the pigment is 26.5 g (in a mass ratio of 0.4:1 to the negative light sensitive resin composition), the modifying adjuvant is 0.084 g (in a mass ratio of 0.002:1 to the solid fractions in the negative light sensitive resin composition), and the solvent is 624 g (in a mass ratio of 15:1 to the solid fractions in the negative light sensitive resin composition).

Sample 4: the alkaline soluble resin prepared in the aforementioned Example 3 is used, while the alkaline soluble resin is 10 g, the light sensitive resin is 8 g (in a mass ratio of 0.8:1 to the alkaline soluble resin), the photoinitiator is 0.14 g (in a mass ratio of 0.0008:1 to the negative light sensitive resin composition), the pigment is 26.5 g (in a mass ratio of 0.15:1 to the negative light sensitive resin composition), the modifying adjuvant is 0.36 g (in a mass ratio of 0.008:1 to the solid fractions in the negative light sensitive resin composition), and the solvent is 130 g (in a mass ratio of 2.9:1 to the solid fractions in the negative light sensitive resin composition).

Sample 5: the alkaline soluble resin prepared in the aforementioned Example 4 is used, while the alkaline soluble resin is 10 g, the light sensitive resin is 6 g (in a mass ratio of 0.6:1 to the alkaline soluble resin), the photoinitiator is 0.13 g (in a mass ratio of 0.0008:1 to the negative light sensitive resin composition), the pigment is 16 g (in a mass ratio of 0.1:1 to the negative light sensitive resin composition), the modifying adjuvant is 0.16 g (in a mass ratio of 0.005:1 to the solid fractions in the negative light sensitive resin composition), and the solvent is 128 g (in a mass ratio of 4:1 to the solid fractions in the negative light sensitive resin composition).

Sample 6: the alkaline soluble resin prepared in the aforementioned Example 4 is used, while the alkaline soluble resin is 10 g, the light sensitive resin is 9 g (in a mass ratio of 0.9:1 to the alkaline soluble resin), the photoinitiator is 0.24 g (in a mass ratio of 0.0006:1 to the negative light sensitive resin composition), the pigment is 23 g (in a mass ratio of 0.06:1 to the negative light sensitive resin composition), the modifying adjuvant is 0.26 g (in a mass ratio of 0.006:1 to the solid fractions in the negative light sensitive resin composition), and the solvent is 336 g (in a mass ratio of 7.9:1 to the solid fractions in the negative light sensitive resin composition).

In the aforementioned samples of the negative light sensitive resin compositions, for the consistency of the experimental results, a mixture of pentaerythritol pentaacrylate and ethylene glycol monomethyl ether acetate in a ratio of 1:5 is employed for all light sensitive resins containing ethylene unsaturated double bonds; benzoyl is employed for all photoinitiators; the modifying adjuvants comprise γ-(2,3-epoxypropyloxy)propyltrimethoxysilane (a binding promoter), 2,6-di-tert-butyl-p-cresol (an antioxidant), 2-hydroxyl-4-methoxybenzophenone (a UV light absorber), sodium polymethacrylate (an anti-flocculant), and Coat-O-Sil1211 (a leveling agent); and Monarch 120 black pigment is employed for all pigments.

The light sensitive resins, photoinitiators, modifying adjuvants and pigments can be selected from other known materials.

The light sensitive resin comprising ethylene unsaturated bonds may be a reaction product of an acrylate compound and a polyol. Such an acrylate compound include at least one of methyl methacrylate, n-butyl methacrylate, isobutyl methacrylate, ethyl methacrylate, isooctyl methacrylate, hydroxypropyl methacrylate, methacrylate hydroxyethyl, methacrylic acid, methyl acrylate, butyl acrylate, ethyl acrylate, hydroxypropyl acrylate, hydroxyethyl acrylate, isooctyl acrylate, ethylene glycol diacrylate, diethyl diacrylate, ethylene glycol dimethacrylate, triethylene glycol diacrylate, tetraethylene glycol diacrylate, tetraethylene glycol dimethacrylate, butylene glycol dimethacrylate, butylene glycol diacrylate, propylene glycol diacrylate, di(poly)pentaerythritol pentaacrylate, ethoxyl-(15)-trihydroxymethylpropyl triacrylate, and propyloxyoctylpentylethylene glycol diacrylate.

The photoinitiator may be a radical photoinitiator and/or a cationic photoinitiator, for example, a benzoyl photo polymerization initiator such as benzoyl, benzoyl methyl ether, benzoyl ethyl ether, benzoyl isopropyl ether, benzoyl isobutyl ether and like; a radical initiator such as 2,4,6-trimethyl benzoyl diphenyl phosphine oxide, 2,2'-bis(o-chlorophenyl)-4,4',5,5'-tetraphenyl-1,2'-biimidazole, 2-ethyl anthraquinone, benzil, camphorquinone, methyl phenylglyoxylate and like; acid generating agents such as 4-hydroxyphenyl dimethyl sulfonium p-toluene sulfonate, triphenyl sulfonium hexafluoroantimonate, diphenyl iodonium hexafluoroantimonate, benzoyl toluene sulfonate and like; an acetylphenol compound such as 2-hydroxy-2-methyl-1-phenylpropan-1-one, diethoxyacetylphenol, 2-methyl-2-morpholino-1-(4-methyl-phenylthio), 2-hydroxy-2-methyl-1-[4-(methylvinyl)phenyl]propan-1-one and the like; and a triazine compound such as 2,4-bis(trichloromethyl)-6-(4-methoxyphenyl)-1,3,5-triazine, 2,4-bis(trichloromethyl)-6-piperonyl-1,3,5-triazine, 2,4-bis (trichloromethyl)-6-[2-(5-methylfuran)-vinyl]-1,3,5-triazine and the like. Preferably, 2-methyl-2-morpholino-1-(4-methyl-phenylthio), 2,4-bis (trichloromethyl)-6-piperonyl-1,3,5-triazine, 2-phenylbenzyl-2-dimethylamin-1-(4-morpholinylbenzylphenyl)butanone and the like are employed.

The modifying adjuvant may comprise a binding promoter, an oxidant, a UV light absorber, an anti-flocculant, a leveling agent and the like. The binding promoter can be γ-(2,3-epoxypropyloxy)propyltrimethoxylsilane, β-(3,4-epoxycyclohexane)ethyltrimethoxylsilane, γ-aminopropyltriethoxylsilane, long chain alkyltrimethoxylsilane, vinyltriethoxylsilane, vinyltrimethoxylsilane, γ-chloropropyltriethoxylsilane, bis-(γ-triethoxylsilylpropyl) tetrasulfide, anilinomethyltriethoxylsilane, N-β(aminoethyl)-γ-aminopropyltrimethoxylsilane, N-β-aminoethyl)-γ-aminopropyltriethoxylsilane, N-β(aminoethyl)-γ-aminopropylmethyldimethoxylsilane, γ-(2,3-epoxypropyloxy) propyltrimethoxylsilane, γ-(methylacryloyloxy) propyltrimethylsilane, γ-mercaptopropyltrimethoxylsilane, γ-mercaptopropyltriethoxylsilane and the like; the antioxidant may be 2,6-di-tert-butyl-p-cresol, n-octadecyl β-(4-hydroxyphenyl-3,5-di-tert-butyl)butyrate, pentaerythritol tetra-(β-(3,5-di-tert-butyl -4-hydroxyphenyl)butyrate, N,N'-bis[3, 5-di-tert-butyl-4-hydroxyphenyl)acryloyl]hydrazine, bisoctadecyl thiodiproprionate, 4,4'-thiobis(6-tert-butyl-3-methylphenol) and the like; the UV light absorber may be 2-hydroxyl-4-methoxybenzophenone, 2,4-dihydroxybenzophenone, 2-hydroxyl-4-n-octyloxybenzophenone, 2-hydroxyl-4-n-octyloxybenzophenone, 2-(2-hydroxyl-5-methylphenyl)-benzotriazole, 2-(2'-hydroxyl-3'-tert-butyl-5'-methylphenyl)-5-chlorobenzotriazole, 2-(2'-hydroxyl-3',5'-di-tert-butylphenyl)-5-chlorobenzotriazole, 2-(2'-hydroxyl-3',5'-dipentylphenyl)-benzotriazole and the like; the anti-flocculant may be sodium polymethacrylate, sodium acrylate and the like; and the leveling agent may be Coat-O-Sil1211, Coat-O-Sil2810, EFKA3777, EFKA2022, HX-3010, HX-3110, HX-3310, HX-3020, HX-3320, HX-3040, HX-3140, HX-3070, HX-3080, HX-3180, HX-3181, HX-3380, BYK310, BYK323, BYK333, BYK358N, BYK06, MFPX50 and the like.

The pigment may be a single pigment or a mixture of multiple pigments, which may include a red pigment, a yellow pigment, an orange pigment, a blue pigment, a green pigment, a black pigment and the like; among them, the red pigment may be perylenes, quinacridones, pyrrolopyrroles and the like, such as P.R.122, P.R.123, P.R.177, P.R.179, P.R.190, P.R.202, P.R.210, P.R.224, P.R.254, P.R.255, P.R.264, P.R.270, P.R.272, P.R.122; the yellow pigment may be azo, diazo condensation and hetrocycles such as P.Y.1, P.Y.12, P.Y.3, P.Y.13, P.Y.83, P.Y.93, P.Y.94, P.Y.95, P.Y.109, P.Y.126, P.Y.127, P.Y.138, P.Y.139, P.Y.139, P.Y.147, P.Y.150, P.Y.174, P.Y.180; the orange pigment may be azo, pyrrolidone, benzidine and the like, such as P.O.5, P.O.13, P.O.16, P.O.34, P.O.36, P.O.48, P.O.49, P.O.71, P.O.73; the blue pigment may be phthalocyanine, indanthrene blue, C.I. Pigment Blue 1, C.I. Pigment Blue 19, C.I. Pigment Blue 22, C.I. Pigment Blue 60, C.I. Pigment Blue 64 and the like; the green pigment may be C.I. Pigment Green 2, C.I. Pigment Green 8, C.I. Pigment Green 10 and the like; the black pigment may be Monarch120, Monarch280, Monarch430, Monarch460, Monarch800, Monarch1300, Monarch900, Monarch717, Monarch5701, REGAL660R, REGAL400R, REGAL330R, REGAL99R, REGAL415, REGAL415R, REGAL250, REGAL250R, REGAL330, BLACK PEARLS 480, BLACK PEARLS 130, Special Black 4, Special Black 250, Special Black 350, Special Black 100, Printex90, Printex95, Printex85, Printex75, Printex55, Printex30, Printex40, Printex45, Printex3, Printex A, Printex G, MA7, MA8, MA11, MA100, MA220, MA230, #50, #52, #45, #47, #2700, #2650, #2200, #1000, #990, #900 and the like.

The solvent may be formic acid, acetic acid, chloroform, acetone, butanone, fatty alcohol, ethylene glycol monomethyl ether, ethylene glycol monomethyl ether, ethylene glycol monopropyl ether, ethylene glycol monobutyl ether, diethylene diethyl ether ethyl acetate, methylethyl ketone, methylisobutyl ketone, ethylene glycol monomethyl ether, γ-butyrolactone, ethyl 3-ethoxypropionate, butylcarbitol, butylcarbitol acetate, propylene monomethyl ether, propylene monomethyl ether acetate, cyclohexane, xylene, isopropanol and the like. It is preferably at least one of propylene monomethyl ether, propylene monomethyl ether acetate, cyclohexane, butylcarbitol, butylcarbitol acetate and γ-butyrolactone.

The light sensitive resins, photoinitiors, modifying adjuvants, pigments, solvents and the like enumerated above are still some examples of alternative materials and do not constitute limitations on the invention. A person skilled in the art may elect to use other well known materials for the negative light sensitive resin composition in the embodiments (for example, adding new modifying adjuvants or removing unnecessary modifying adjuvants and the like).

The aforementioned various samples of negative light sensitive resin compositions are spin-coated at a rotary speed of 400~700 rpm onto a glass substrate of 100 mm×100 mm. The following individual tests are conducted subsequently.

Pin hole test: the negative light sensitive resin composition on the glass substrate is baked to dryness at 80☐ for 3 min and subjected to microscopic observation to see whether there existed micro holes.

Evenness of surface coating test: after the negative light sensitive resin composition on the glass substrate is baked to dryness according to the aforementioned process, it is exposed under a high voltage mercury lamp at the conditions of an illuminance of 15 mJ/cm2 for 8 s, and then developed in a solution of 0.5% NaOH. Multiple groups of data concerning the thickness of the pixel film at different locations of the film layer are obtained using a Tencor stylus profiler. Evenness of surface coating=[(Hmax−Hmin)×100%]/Havg, wherein the Hmax is the maximum film thickness, Hmin is the minimum film thickness and Havg is the average of the film thickness.

Thermal endurance test: the resin film which had been spin-coated, baked to dryness, exposed and developed according to aforementioned processes is subjected to postbaking at 250☐ for 1 hour. Multiple groups of data of the thickness of the pixel film before and after the postbaking are obtained using a Tencor stylus profiler. Thermal endurance= [(Hbefore−Hafter)×100%]/Hbefore, wherein Hbefore is the thickness of the film before the postbaking, and Hafter is the thickness of the film after the postbaking.

Edge neatness test: the resin film which had been spin-coated, baked to dryness, exposed and developed according to aforementioned processes is subjected to observation under a 200× microscope to see whether its edge is neat and whether it has burrs.

Storage stability test: both a freshly prepared negative light sensitive resin composition and a negative light sensitive resin composition after two weeks' storage are individually spin-coated, baked to dryness, exposed and developed according to aforementioned processes, and the individual duration of exposure to achieve a pattern with neat edges of them are measured.

Resolution test: the negative light sensitive resin composition is spin-coated, baked to dryness, exposed and developed according to aforementioned processes, wherein during the exposure 20 μm, 15 μm, 12 μm, 10 μm, 8 μm, 6 μm, 3 μm, 2 μm and 1 μm are individually chosen as the line width of the mask, and the minimum line width that enabled neat edges is the resolution.

Table 1 shows the performance of different samples of the negative light sensitive resin compositions.

TABLE 1

| Number | Pinhole | Evenness of Surface Coating | Thermal Endurance | Neatness of the Edges | Storage Stability Freshly Prepared | After 2 Weeks' Storage | Resolution |
|---|---|---|---|---|---|---|---|
| Sample 1 | No | less than 1% | less than 1% | A few burrs | 8 | 12 | 20 μm |
| Sample 2 | No | less than 2.5% | less than 1% | A few burrs | 8 | 10 | 20 μm |
| Sample 3 | No | less than 1% | less than 1% | A few burrs | 8 | 10 | 15 μm |
| Sample 4 | No | less than 1% | less than 1% | A few burrs | 8 | 10 | 15 μm |
| Sample 5 | No | less than 1% | less than 1% | Neat edges | 8 | 8 | 10 μm |
| Sample 6 | No | less than 1% | less than 1% | Neat edges | 8 | 10 | 5 μm |

As seen from the above table, the negative light sensitive resin compositions of the embodiments of the invention has good pin hole performance, evenness of surface coating, thermal endurance, edge neatness, storage stability, resolution and the like, and possess excellent overall performance.

As shown in FIG. 1, an embodiment of the invention provides a color filter 100 comprising a substrate 1 and a light filtering structure formed by the curing of the aforementioned pigment containing negative light sensitive resin composition on the substrate 1.

The color filter 100 of the embodiment has a light filtering structure on the substrate 1, wherein in the light filter structure comprises light shielding parts 24 formed by the curing of the aforementioned pigment containing negative light sensitive resin composition that contains a black pigment, as well as transparent parts 21, 22 and 23 obtained by the curing of the aforementioned pigment containing negative light sensitive resin compositions that contain the three pigments of red, green and blue, respectively, which are disposed between the light shielding parts 24, wherein the transparent parts 21, 22 and 23 of different colors correspond to different sub-pixel of the liquid crystal display device. Since the light filtering structure on the color filter of the embodiment is formed by the curing of the aforementioned pigment containing negative light sensitive resin composition, it has small steps and has good pin hole performance, evenness of surface coating, thermal endurance, edge neatness, storage stability, resolution and the like.

An embodiment of the invention provides a liquid display device comprising the aforementioned color filter.

Since the aforementioned color filter is employed in the liquid display device of the embodiment, this color filter has a light filtering structure having small steps and good performance.

The aforementioned are only specific way to carry out the invention. However, it does not limit the scope of protection of the invention. Any person skilled in the art may easily conceive of modifications or substations within the disclosure of the invention, which should be encompassed in the scope of protection of the invention. Therefore, the scope of protection of the invention shall be determined by the scope of protection of the claims.

The invention claimed is:

1. A negative light sensitive resin composition comprising an alkaline soluble resin, which is a terpolymer, or a derivative of the terpolymer, made from the following three monomers: styrene, α-pinene, and a carboxylic acid or anhydride containing an unsaturated double bond;
a light sensitive resin containing ethylene unsaturated double bonds, which is in a mass ratio of 0.1 to 1.2:1 to the alkaline soluble resin;
a photoinitiator, which is in a mass ratio of 0.0001 to 0.001:1 to the negative light sensitive resin composition;
a modifying adjuvant, which is in a mass ratio of 0.001 to 0.01:1 to the solid fraction in the negative light sensitive resin composition; and
a solvent, which is in a mass ratio of 2 to 20:1 to the solid fraction in the negative light sensitive resin composition;
wherein among the three monomers of the alkaline soluble resin, the carboxylic acid or anhydride containing an unsaturated double bond has a molar ratio of 0.2 to 1:1 to styrene; and α-pinene is in a molar ratio that is higher than 0 but lower than or equal to 1: 1 to styrene.

2. The negative light sensitive resin composition according to claim 1, wherein among the three monomers of the alkaline soluble resin,
the carboxylic acid or anhydride containing an unsaturated double bond has a molar ratio of 0.8 to 1:1 to styrene; and α-pinene is in a molar ratio of 1:1 to the carboxylic acid or anhydride containing an unsaturated double bond.

3. The negative light sensitive resin composition according to claim 1, wherein the carboxylic acid or anhydride containing an unsaturated double bond is any one of acrylic acid, methacrylic acid, crotonic acid, maleic acid, fumaric acid, citraconic acid, mesaconic acid, itaconic acid, acrylic anhydride, methacrylic anhydride, crotonic anhydride, maleic anhydride, fumaric anhydride, citraconic anhydride, mesaconic anhydride and itaconic anhydride.

4. The negative light sensitive resin composition according to claim 1, wherein the alkaline soluble resin has a structure of

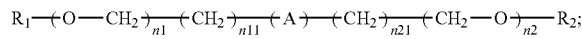

wherein A represents a copolymer chain segment consisting of n3

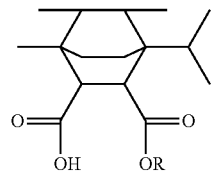

groups and n4

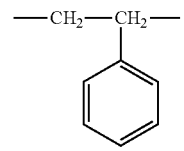

groups;

n1 is an integer of 0 to 5, with a proviso that when n1 is 0, n11 is also 0, and when n1 is not 0, n11 is 1;

n2 is an integer of 0 to 5, with a proviso that when n2 is 0, n21 is also 0, and when n2 is not 0, n21 is 1;

n3 is an integer of 20 to 400;

n4 is an integer of 20 to 400, and n4 is higher than or equal to n3;

R1 is any one of an acrylate substituent, a methacrylate substituent, and a crotonate substituent;

R2 is any one of an acrylate substituent, a methacrylate substituent, and a crotonate substituent; and R is hydrogen.

5. The negative light sensitive resin composition according to claim 4, wherein A represents an alternating copolymer chain segment consisting of

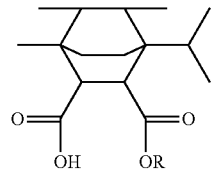

group and

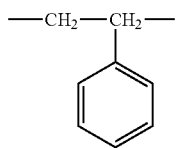

group.

6. The negative light sensitive resin composition according to claim 1, wherein
the weight average molecular weight of the alkaline soluble resin is from 6000 Da to 40000 Da.

7. The negative light sensitive resin composition according to claim 1, wherein
the mass ratio between the light sensitve resin and the alkaline soluble resin is from 0.4 to 1.2:1;
the mass ratio between the photoinitiator and the negative light sensitive resin composition is from 0.0005 to 0.001:1;
the mass ratio between the modifying adjuvant and the solid fraction in the negative light sensitive resin composition is from 0.002 to 0.008:1; and
the mass ratio between the solvent and the negative light sensitive resin composition is from 2 to 15:1.

8. The negative light sensitive resin composition according to claim 1, wherein
the modifying adjuvant includes at least one of a binding promoter, an antioxidant, an ultraviolet light absorbent, an anti-flocculant, and a leveling agent.

9. The negative light sensitive resin composition according to claim 1, wherein
the negative light sensitive resin composition has a viscosity from 1.2 cps to 6 cps at 25° C.

10. The negative light sensitive resin composition according to claim 1, further comprising:
a pigment, which is in a mass ratio of 0.04 to 0.15:1 to the negative light sensitive resin composition.

11. A color filter comprising a substrate, wherein
the substrate comprises a light filtering structure formed thereon by curing the negative light sensitive resin composition according to claim 1.

12. A crystal liquid display device comprising the color filter according to claim 11.

* * * * *